United States Patent [19]

Angerstein et al.

[11] Patent Number: 4,674,093

[45] Date of Patent: Jun. 16, 1987

[54] CIRCUIT ARRANGEMENT FOR ACTUATING SEMICONDUCTOR LASERS

[75] Inventors: Jörg Angerstein, Flein; Elmar Wagner, Heilbronn; Stefanos Dermitzakis, Heilbronn-Neckargartach, all of Fed. Rep. of Germany

[73] Assignee: Telefunken electronic GmbH, Heilbronn, Fed. Rep. of Germany

[21] Appl. No.: 628,653

[22] Filed: Jul. 6, 1984

[30] Foreign Application Priority Data

Jul. 14, 1983 [DE] Fed. Rep. of Germany ....... 3325420

[51] Int. Cl.$^4$ ............................................. H01S 3/096
[52] U.S. Cl. ......................................... 372/38; 372/29
[58] Field of Search ....................... 372/38, 31, 26, 29; 250/205

[56] References Cited

U.S. PATENT DOCUMENTS

| 3,898,583 | 8/1975 | Shuey ..................................... 372/38 |
| 3,909,745 | 9/1975 | Dye ........................................ 372/38 |
| 4,109,217 | 8/1978 | Brackett et al. ......................... 372/38 |
| 4,339,822 | 7/1982 | Kolodzey .............................. 372/26 |

FOREIGN PATENT DOCUMENTS

| 2604805 | 2/1976 | Fed. Rep. of Germany . |
| 2218431 | 12/1977 | Fed. Rep. of Germany . |
| 2854000 | 4/1982 | Fed. Rep. of Germany . |
| 2045516 | 10/1980 | United Kingdom . |

OTHER PUBLICATIONS

"CQL10 Semiconductor Laser for Information Readout," Electronic Components and Applications, vol. 3, No. 1, (Nov. 1980), pp. 2-5.

Michael Hoiz et al, "Optischer Repeater für 280 Mbit/s," Wiss.Ber. AEG-Telefunken 53 (1980), pp. 56-61.

Primary Examiner—James W. Davie
Attorney, Agent, or Firm—Spencer & Frank

[57] ABSTRACT

A circuit arrangement for actuating semiconductor lasers with the transmitted optical power being controlled with the aid of a photodiode optically coupled to the laser radiation, whose amplified photoelectric current controls the current of the laser in such a way that its radiation capacity remains constant, is to be improved, in particular, such that the circuitry expenditure is low, the band width large and the operating point of the laser easy to set, and, furthermore, such that a digital or HF signal for modulation of the laser radiation can be coupled without difficulty.

20 Claims, 5 Drawing Figures

CIRCUIT ARRANGEMENT FOR ACTUATING SEMICONDUCTOR LASERS

BACKGROUND OF THE INVENTION

Modern semiconductor lasers are suitable as radiation sources in CW operation up to high modulation frequencies (several GHz).

CW semiconductor lasers are operated in such a manner that in the current radiation capacity characteristic curve of the laser, preferably above the threshold current $I_{th}$, a certain DC operating point is set by a preliminary current $I_F$. As required, a digital or HF signal is then modulated, or the laser is simply used as DC radiation source. In each case, it is necessary for various reasons (ageing, temperature dependence, etc.) to keep constant or stabilize the optical power of the laser.

A photodiode which is optically coupled to the laser radiation and is mostly arranged on the same base as the laser chip is primarily used for the stabilization. The photoelectric current of the photodiode, amplified via a control circuit, then controls the current $I_F$ of the laser in such a way as to keep the radiation capacity constant.

SUMMARY OF THE INVENTION

The object underlying the invention is to improve a circuit arrangement for actuating semiconductor lasers, with the optical power transmitted being controlled with the aid of a photodiode optically coupled to the laser radiation such that the circuitry expenditure is very low, the band width large, and the operating point of the laser easy to set, and such that the circuit arrangement, furthermore, necessitates basically only one supply voltage and enables easy coupling of a digital or HF signal for modulation of the laser radiation.

This object is attained in accordance with the invention in that the photodiode operates as signal source for a transimpedance amplifier which is comprised of (at least) two transistors and whose output current is simultaneously the control current of the semiconductor laser.

BRIEF DESCRIPTION OF THE DRAWINGS

The invention will now be explained with reference to some circuitry examples.

DESCRIPTION OF THE PREFERRED EMBODIMENTS

Figure 1:
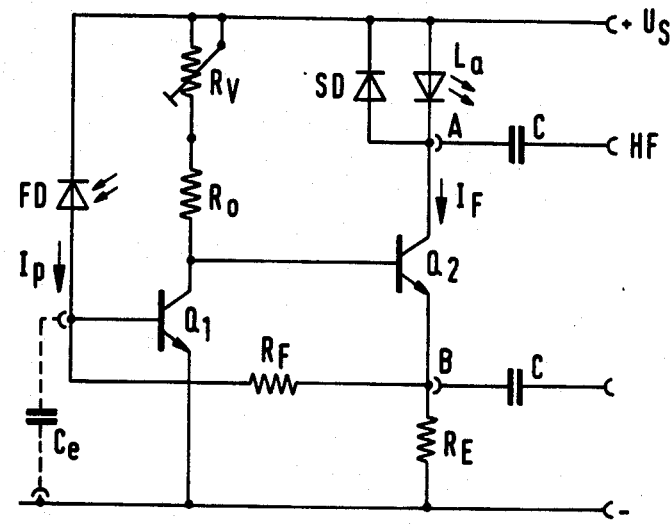
FIG. 1 shows a laser actuating arrangement in the basic form according to the invention.

The laser actuating circuit is illustrated in its basic form in FIG. 1. It consists of the two transistors $Q_1$, $Q_2$, the photodiode FD and four resistors $R_E$, $R_F$, $R_O$ and $R_V$, with $R_V$ being in the form of an adjustment resistor.

The diode SD is connected as a protective diode antiparallel to the laser $L_a$ and has no function other than that of protecting the laser from negative voltages. It should, therefore, be a rapid switching diode.

The transistors $Q_1$ and $Q_2$ form a transimpedance amplifier with the photodiode FD as signal source. The output current of the amplifier, i.e., the collector current of $Q_2$, is simultaneously the control current $I_F$ of the semiconductor laser $L_a$.

Accordingly, the laser current $I_F$ is directly related to the photoelectric current $I_P$ through the current amplification $V_i$ of the amplifier.
Approximated:

$$V_i \approx R_F/R_E = I_F/I_P$$

or $$I_F = -I_P \cdot V_i.$$

The photoelectric current $I_P$ is proportional to the optical power P emitted from the laser:

$$I_P = S \cdot P.$$

S represents the sensitivity of the photodiode.
It therefore follows that:

$$I_F = -S V_i P.$$

Accordingly, for every change $\Delta P$ in the power, there occurs the current change $\Delta I_F = -S \cdot V_i \cdot \Delta P$ which displaces the operating point on the laser characteristic curve such that the change in the power is decreased and disappears.

Since the transimpedance amplifier which effects the countercoupling is a definite wide band amplifier with high limit frequency, the optical countercoupling and control also remain effective up to very high frequencies, more precisely, up to the limit frequency $f_g$ of the amplifier with the photodiode as source.

For frequencies larger than the limit frequency $f_g$ of the controlled system, the control causes the optical power to be stabilized to a certain mean value. If HF transistors are used for $Q_1$, $Q_2$, the limit frequency $f_g$ of the transimpedance amplifier is, in approximated terms, inversely proportional to the product $R_F \cdot C_F$, $$f_g \sim (1/2\pi \cdot R_F \cdot C_P),$$

with $C_P$ being the capacitance of the photodiode and $R_F$ the countercoupling resistance of the amplifier.

With low-capacitance rapid photodiodes, $f_g$ reaches very high values. On the other hand, it is very often desired to stabilize to a mean value of the optical power. In this case, the limit frequency is reduced to the desired value by connecting external capacitors $C_e$ to the input of the amplifier.

The laser radiation may be modulated with a signal at point A or point B via a capacitor C.

Figure 2:
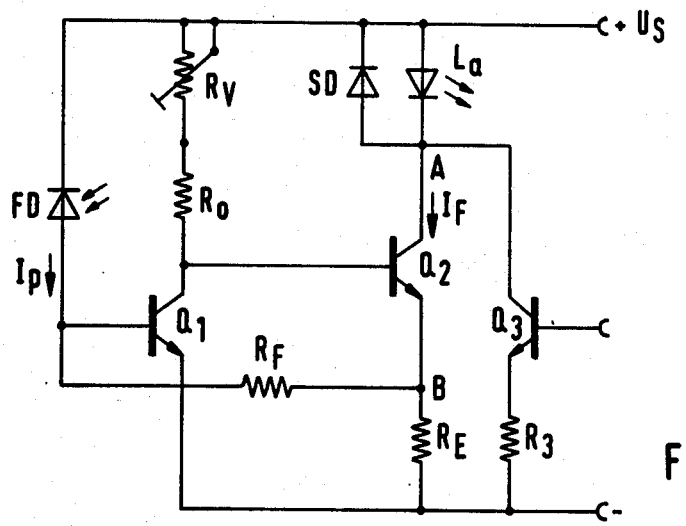
FIG. 2 shows a circuit arrangement which has been modified with respect to the modulation of the laser radiation by use of an additional transistor.
Figure 3:
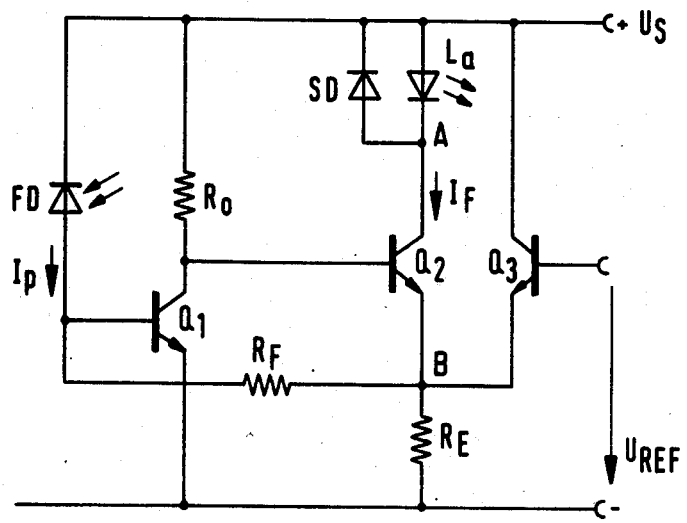
FIG. 3 shows a circuit arrangement with setting of the operating point of the laser with the aid of a reference voltage and with an additional transistor for modulation of the laser radiation with a digital or HF signal.

Another possibility of modulating the laser radiation with a digital or HF signal is shown in FIG. 2 and FIG. 3. Here, an additional transistor $Q_3$ which is connected with its emitter to point B, FIG. 3, or with its collector to point A, FIG. 2, is used, with, in this case, the emitter being connected via a resistor $R_3$ to the negative pole of the supply voltage source. In both cases, the laser $L_a$ can then be modulated with the effective signal via the base of the transistor $Q_3$.

Figure 5:
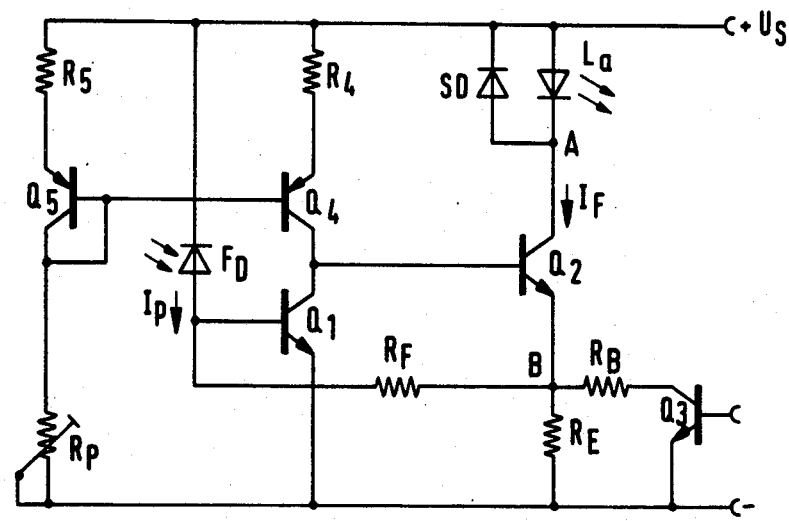
FIG. 5 shows a modified circuit arrangement wherein the resistors provided in the circuit arrangement according to FIG. 1 for determining the laser current are replaced by a current mirror circuit comprised of two transistors.

The circuit variant shown in FIG. 5 is also suitable for modulation of the laser radiation with an external signal at point B. Here, an additional transistor $Q_3$, connected to the resistor $R_B$ parallel to the resistor $R_E$ is likewise used.

The transistor $Q_3$, may also be the output of a TTL gate with open collector outputs.

The connection of $Q_3$ in FIG. 3 corresponds to the output of an ECL gate. Accordingly, at point B the laser may also be directly modulated with a gate of this rapid logic.

Figure 4:
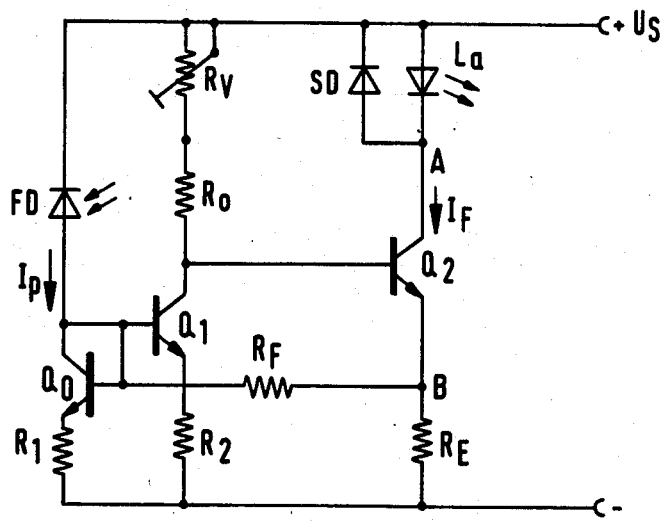
FIG. 4 shows a variant of the basic circuit arrangement according to FIG. 1 with an additional transistor which forms with the first transistor of the transimpedance amplifier a current mirror circuit.

In the case of FIGS. 1, 2 and 4, the operating point and the operating range of the laser in the current power characteristic curve are set roughly with the resistor $R_E$ and precisely with the resistor $R_V$. With predetermined resistances $R_F$ and $R_E$, the resistor $R_O$ determines the maximum currrent $I_{Fmax}$ and the sum $R_O+R_{Vmax}$ the minimum current $I_{Fmin}$ through the laser $L_a$.

Two further possibilities of setting the operating point of the laser are shown in FIGS. 3 and 5. In the circuit arrangement according to FIG. 3, the operating point is fixed with the aid of a reference voltage $U_{REF}$ at the base of the transistor $Q_3$. In this case, the resistor $R_V$ is eliminated with the result that only the resistor $R_O$ is located between the base of the first transistor $Q_1$ and the positive pole of the supply voltage source.

In the circuit arrangement shown in FIG. 5, the resistors $R_V$, $R_O$ are replaced by a current mirror circuit $Q_4$, $Q_5$. Here, the operating point is set precisely with the variable resistor $R_P$. In this case, the adjustment resistor $R_V$ of FIG. 1 is placed between the negative pole and the collector base contacts of the transistor $Q_5$ which are connected to one another.

The advantage of the circuit arrangement of FIG. 5 over that shown in FIG. 1 is that in the case of FIG. 5, the collector of $Q_4$ is now connected as current source to the collector of $Q_1$. This current source (collector of $Q_4$) corresponds, almost independently of the current, to a large load resistance for the transistor $Q_1$ so that the internal amplification of the transimpedance amplifier comprised of the transistors $Q_1$ and $Q_2$ remains large and stable in a wide dispersion range.

The characteristics of the transimpedance amplifier therefore also become dependent on the set operating point and current to a minor degree. The emitters of the PNP transistors $Q_4$ and $Q_5$ are each conductively connected via a resistor $R_4$ and $R_5$, respectively, to the cathode of the photodiode FD which is connected to the positive pole of the voltage source.

A further variant of the basic circuit arrangement of FIG. 1 is shown in FIG. 4. Here, an additional transistor $Q_0$ which forms with the transistor $Q_1$ a current mirror circuit is used. $Q_1$ and $Q_2$ are still connected as transimpedance amplifier.

This circuit has the advantage of having very good temperature stability in the event that the transistors $Q_1$ and $Q_0$ are thermally coupled to one another.

If suitable HF or UHF transistors are used, the limit frequency of the control circuit according to the invention reaches values of several 100 MHz and is primarily only limited by the limit frequency of the photodiode FD. If necessary, the circuit may also be connected to two supply voltages.

What is claimed is:

1. A circuit arrangement for actuating and controlling a semiconductor laser constructed to receive a control current and to produce laser radiation having an emitted optical power proportional to the control current, said arrangement comprising: a photodiode optically coupled to receive radiation emitted by the laser and to produce a photoelectric current; and a transimpedance amplifier comprising first and second transistors and having a signal input connected to receive the photoelectric current produced by said photodiode and a signal output for providing an output current directly proportional in magnitude to the photoelectric current, said signal output being connected directly to the laser for supplying the output current as the control current to the laser for causing the control current to the laser to be controlled in a manner to maintain the radiation capacity of the laser substantially constant.

2. A circuit arrangement as defined in claim 1 wherein the base of said first transistor is connected to said photodiode and constitutes the signal input of said amplifier and the base of said second transistor is connected to said first transistor to receive an amplified signal from said first transistor.

3. Circuit arrangement according to claim 2 further comprising a precision adjustment resistor ($R_V$) for the operating point of the laser ($L_a$) connected between the collector of the first transistor ($Q_1$), whose base is connected to the anode of the photodiode (FD), and the cathode of the photodiode, and a countercoupling resistor ($R_F$) connected between the emitter of the second transistor ($Q_2$) and the base of the first transistor ($Q_1$).

4. Circuit arrangement according to claim 3, wherein a resistor ($R_O$) is connected in series with the precision adjustment resistor ($R_V$) and the resistor ($R_O$) determines the maximum current and the sum of the resistors ($R_O+R_{Vmax}$) the minimum current through the laser.

5. Circuit arrangement according to claim 3, wherein a protective diode (SD) is connected antiparallel to the laser ($L_a$) and in the collector circuit of the second transistor ($Q_2$).

6. Circuit arrangement according to claim 1, wherein the photodiode is a low-capacitance rapid photodiode.

7. Circuit arrangement according to claim 1, wherein external capacitances ($C_e$) are connected to the input of the transimpedance amplifier.

8. Circuit arrangement according to claim 3, wherein the laser radiation can be modulated with a digital or HF signal via a capacitor connected to the collector or to the emitter of the transistor on the laser side.

9. Circuit arrangement according to claim 1, wherein the laser radiation is modulated via an additional transistor ($Q_3$) which is connected parallel to the series connection comprising laser ($L_a$) and transistor ($Q_2$) and is connected on the emitter side to the emitter of the second transistor ($Q_2$), and via whose base the laser ($L_a$) is modulated with the effective signal.

10. Circuit arrangement according to claim 9, wherein the laser is directly modulated with an ECL gate.

11. Circuit arrangement according to claim 9, wherein a reference voltage applied to the base of the additional transistor ($Q_3$) serves to set the operating point of the laser ($L_a$).

12. Circuit arrangement according to claim 1, wherein there is provided for modulation of the laser radiation an additional transistor ($Q_3$) which is connected parallel to the series connection comprising the second transimpedance amplifier transistor ($Q_2$) and a resistor ($R_E$) connected in series with the latter, and which is connected on the collector side to the collector of the transistor second ($Q_2$) on the laser side, and via whose base the laser ($L_a$) is modulated with the effective signal, with the emitter of the additional transistor ($Q_3$) being connected via a resistor ($R_3$) to the negative pole of the supply voltage.

13. Circuit arrangement according to claim 1 further comprising a further transistor connected to said first transistor ($Q_1$) of the transimpedance amplifier in a current mirror circuit.

14. Circuit arrangement according to claim 1, wherein the collector of a PNP transistor ($Q_4$) which is connected on the emitter side via a resistor ($R_4$) to the cathode of the photodiode (FD) and forms with a further PNP transistor ($Q_5$) a current mirror circuit is electrically conductively connected to the collector of the first transistor ($Q_1$).

15. Circuit arrangement according to claim 14, wherein a precision adjustment resistor ($R_P$) is connected between the negative pole of the voltage source and the collector base contacts of the transistor ($Q_5$) which are connected to one another.

16. Circuit arrangement according to claim 15, wherein there is provided for modulation of the laser radiation a transistor ($Q_3$), which is connected on the emitter side to the negative pole of the voltage source and on the collector side to a resistor ($R_B$), and the series connection comprising the transistor ($Q_3$), and the resistor ($R_B$) is connected in parallel with a rough adjustment resistor ($R_E$).

17. Circuit arrangement according to claim 3, wherein external capacitances ($C_e$) are connected to the input of the transimpedance amplifier.

18. Circuit arrangement according to claim 3, wherein the laser radiation is modulated via an additional transistor ($Q_3$) which is connected parallel to the series connection comprising laser ($L_a$) and transistor ($Q_2$) and is connected on the emitter side to the emitter of the second transistor ($Q_2$) and via whose base the laser ($L_a$) is modulated with the effective signal.

19. Circuit arrangement according to claim 3, wherein there is provided for modulation of the laser radiation an additional transistor ($Q_3$) which is connected parallel to the series connection comprising the second transimpedance amplifier transistor ($Q_2$) and a resistor ($R_E$) connected in series with the latter, and which is connected on the collector side to the collector of the second transistor ($Q_2$) on the laser side, and via whose base the laser ($L_a$) is modulated with the effective signal, with the emitter of the additional transistor ($Q_3$) being connected via a resistor ($R_3$) to the negative pole of the supply voltage.

20. Circuit arrangement according to claim 3 further comprising a further transistor connected to said first transistor ($Q_1$) of the transimpedance amplifier in a current mirror circuit.

* * * * *